(12) United States Patent
Wu

(10) Patent No.: US 6,404,035 B1
(45) Date of Patent: Jun. 11, 2002

(54) LASER FUSE STRUCTURE

(75) Inventor: Tsung-Chih Wu, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 22 days.

(21) Appl. No.: 09/694,607

(22) Filed: Oct. 23, 2000

(30) Foreign Application Priority Data

Oct. 16, 2000 (TW) ........................................ 89121547 A

(51) Int. Cl.⁷ .............................................. H01L 29/00
(52) U.S. Cl. ........................ 257/529; 257/257; 257/530
(58) Field of Search ................................ 257/529, 530

(56) References Cited

U.S. PATENT DOCUMENTS 5,760,453 A * 6/1998 Chen
6,144,074 A * 7/2000 Akita

* cited by examiner

Primary Examiner—Stephen D. Meier

(57) ABSTRACT

A laser fuse comprising of a conventional laser fuse and an NMOS transistor. The two voltage source terminals of the fuse are connected to a low voltage and a high voltage respectively. A laser window is formed on the high voltage source terminal serving as a fuse-breaking port for a laser beam. The gate terminal of the NMOS transistor is connected to a position between the two input terminals of the fuse. One source/drain terminal of the NMOS transistor is connected to an input terminal while the other source/drain terminal of the NMOS transistor is connected to an output terminal. When the fuse is completely broken, the NMOS transistor is non-conductive because a voltage lower than the threshold voltage of the NMOS transistor is supplied to the gate terminal. Even if the fuse is only partially broken, resistance at the second voltage source is increased so much that the voltage at the gate terminal of the NMOS transistor is again lower than the threshold voltage. Therefore, the NMOS transistor remains in an open state and the output terminal will be unaffected by any voltage at the input terminal.

13 Claims, 3 Drawing Sheets

LASER FUSE STRUCTURE

CROSS-REFERENCE TO RELATED APPLICATION

This application claims the priority benefit of Taiwan application ser. no. 89121547, filed Oct. 16, 2000.

BACKGROUND OF THE INVENTION

1. Field of Invention

The present invention relates to a laser fuse for memory. More particularly, the present invention relates to a type of laser fuse capable of cutting off any input voltage to a memory unit even when the laser fuse is only partially severed.

2. Description of Related Art

In general, a semiconductor memory unit contains a plurality of fuses serving as a pre-starting circuit to be replaced with some defect circuits. Hence, whether or not the safety fuse can be completely broken (or burnt) is a critical issue in the design of memory unit.

FIG. 1 is a schematic cross-sectional diagram showing the structure of a conventional safety fuse. As shown in FIG. 1, a safety fuse 12 is embedded within a p-type substrate 10. There is a laser window 14 above a portion of the fuse 12. The safety fuse 12 is melted away by aiming a laser beam into the laser window 14. Ultimately, a gap is formed in the central portion 16 of the fuse 12 rendering the two ends C' and D' of the safety fuse 12 open.

However, the laser beam may be slightly offset or beam intensity may be too low due to some design errors. FIG. 2 is a top view showing an incompletely cut safety fuse of a conventional safety fuse structure. As shown in FIGS. 2 and 1, a laser beam aims at a section of the laser window 14. A clean cut of the safety fuse 16 is not obtained because of the laser beam is too weak or the beam is offset. Due to the offset of laser beam, a portion of the safety fuse 20 remains outside the cutting beam 18. Consequently, the safety fuse 16 is still partially linked after a laser-cutting operation.

FIGS. 3A and 3B shows another type of safety fuse structure and the way in which the fuse is incompletely broken after a laser cutting operation. As shown in FIG. 3A, a polysilicon layer 24 that serves as an etching barrier layer is normally formed underneath a laser window 22 but above a safety fuse 26. As shown in FIG. 3B, a laser beam 27 acts on the laser window 22. Although the laser beam 27 is able to cut off the polysilicon layer 24 and the safety fuse 26 completely, residual material from the polysilicon layer 24 will flow into the safety fuse 26 area. Due to the presence of residual polysilicon material, the two ends of the safety fuse 26 may reconnect electrically.

SUMMARY OF THE INVENTION

Accordingly, one object of the present invention is to provide a laser fuse inside a memory unit capable of preventing the formation of a partially cut fuse. Hence, an input terminal and an output terminal of the memory unit are in an open state condition after a laser-cutting operation even when the laser beam is slightly offset or power level is slight too low.

To achieve these and other advantages and in accordance with the purpose of the invention, as embodied and broadly described herein, the invention provides a laser fuse between a memory unit and a power source. The safety fuse includes a conventional safety fuse and an NMOS transistor.

The conventional safety fuse has a first voltage source and a second voltage source, which respectively have a low voltage and a high voltage. The second voltage source has a laser window for cutting the safety fuse with a laser beam.

The NMOS transistor has an operating threshold voltage. The gate terminal of the NMOS transistor is connected to a point between the two input terminals of the safety fuse. One source/drain terminal of the NMOS transistor is connected to the input terminal while the other source/drain terminal of the NMOS transistor is connected to the output terminal of the memory unit.

In operation, the low voltage is controlled to a level below the threshold voltage. Hence, the NMOS transistor is incapable of operating and the source/drain terminals are in an open state after the safety fuse is cut by a laser beam. If the laser beam only cuts away a portion of the safety fuse, resistance at the second voltage source is raised. The gate terminal of the NMOS transistor receives a voltage lower than the threshold voltage. Therefore, the NMOS transistor is still incapable of operating and the source/drain terminals are in an open state. In other words, even if the safety fuse is only partially cut, an open state condition between the memory unit and the power source is still ensured.

The safety fuse can be made from a metallic material such as copper or aluminum or a non-metallic material such as polysilicon. The gate terminal of the NMOS transistor is connected to a point between the two terminals of a safety fuse using a metallic junction. The first voltage source of the safety fuse is connected to a low voltage such as a zero volt to ensure that the NMOS transistor remains in a cut-off state once the safety fuse is broken.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
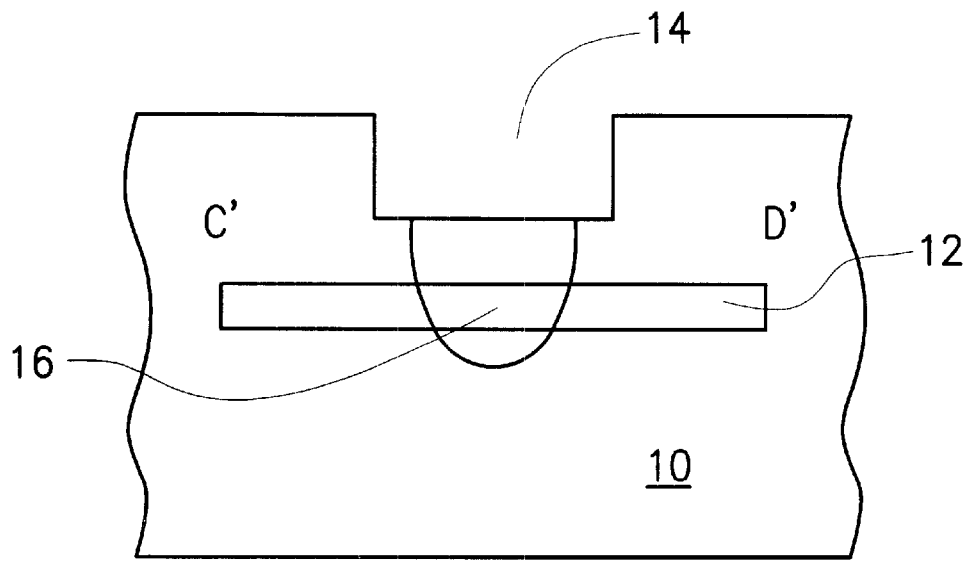
FIG. 1 is a schematic cross-sectional diagram showing the structure of a conventional safety fuse.
Figure 2:
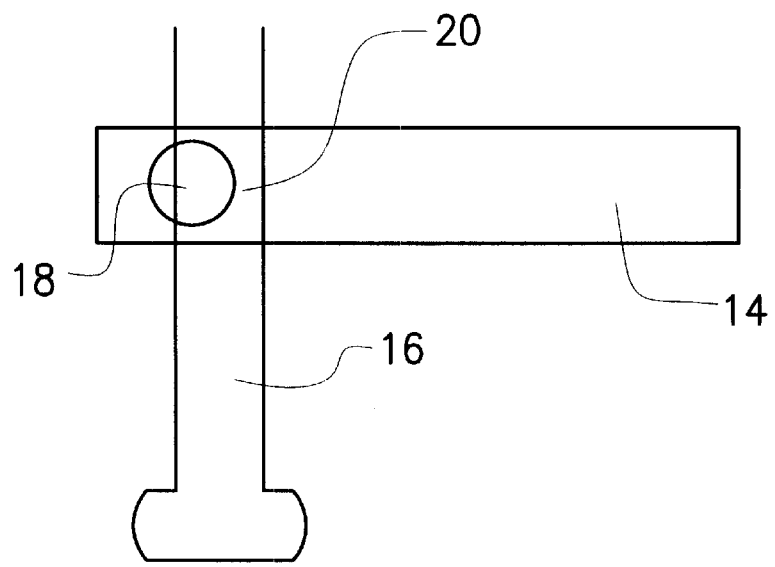
FIG. 2 is a top view showing an incompletely cut safety fuse of a conventional safety fuse structure.
Figure 3A:
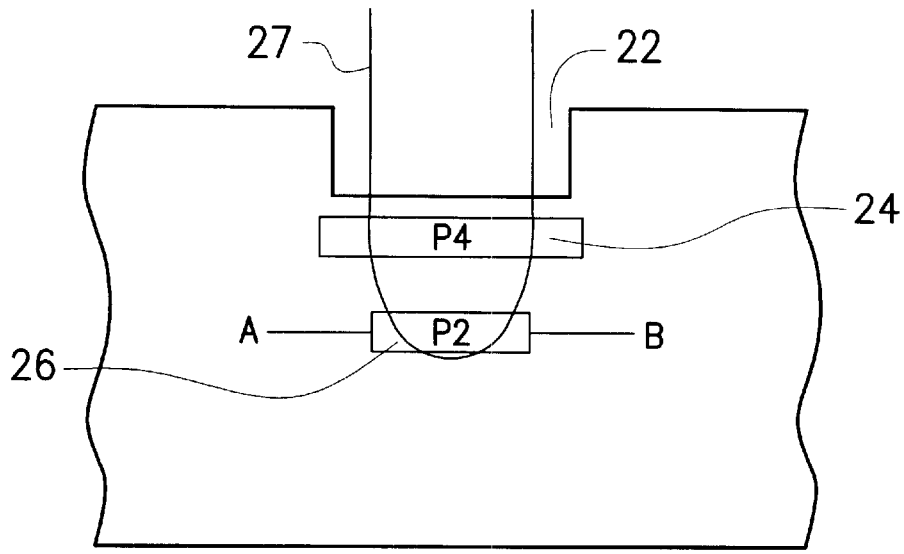
FIGS. 3A and 3B shows another type of safety fuse structure and the way in which the fuse is incompletely broken after a laser cutting operation.
Figure 3B:
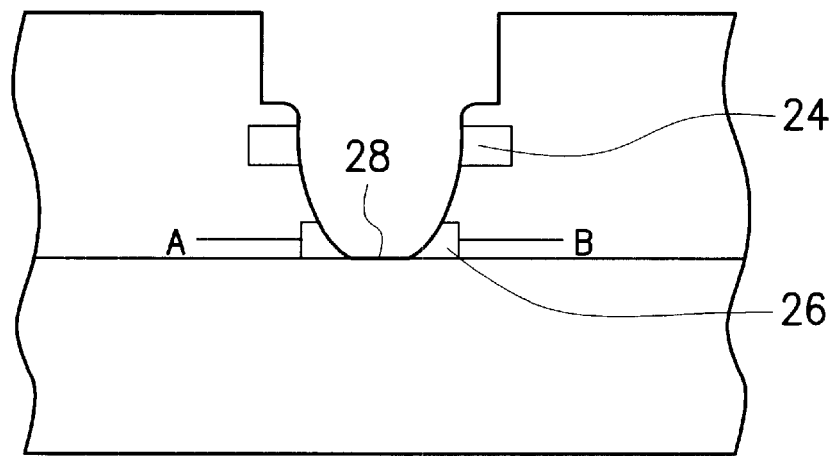

Reference will now be made in detail to the present preferred embodiments of the invention, examples of which are illustrated in the accompanying drawings. Wherever possible, the same reference numbers are used in the drawings and the description to refer to the same or like parts.

Due to errors in the alignment of the laser beam, insufficient power to the laser or the presence of residual polysilicon, a conventional laser fuse may not be completely severed after a laser cutting operation. Hence, a portion of the original input voltage may be leak into a memory unit. This invention is able to prevent any partially connected laser fuse from providing unnecessary connection between the an input terminal and an output terminal of the memory unit, that is, the invention can maintain the input terminal and the output terminal in an opening status.

Figure 4A:
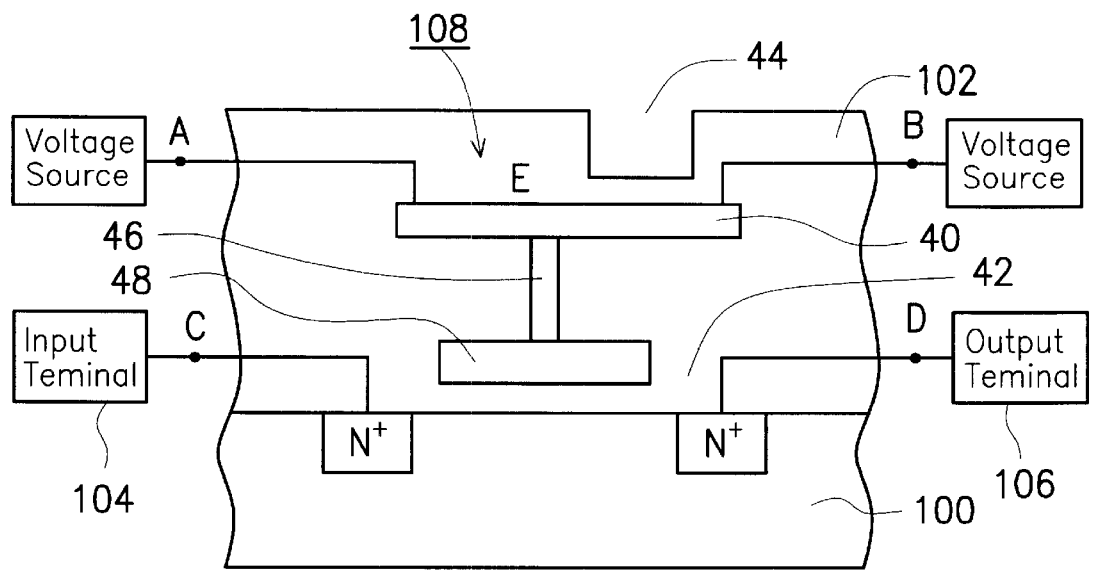
FIG. 4A is a schematic cross-sectional view of a laser fuse according to one preferred embodiment of this invention.
Figure 4B:
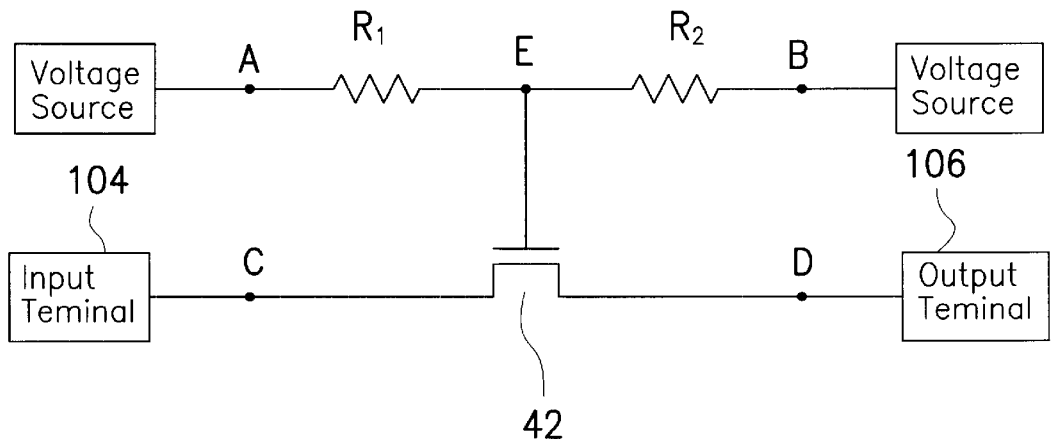
FIG. 4B is an equivalent circuit diagram of the laser fuse of this invention.

FIG. 4A is a schematic cross-sectional view of a laser fuse according to one preferred embodiment of this invention. FIG. 4B is an equivalent circuit diagram of the laser fuse of this invention. As shown in FIG. 4A, a laser fuse structure 108 according to this invention is buried inside an insulation layer above a substrate 100, for example, a p-type substrate 100. The insulation layer 102 can be a silicon oxide layer, for example. The laser fuse structure 108 includes a fuse 40 and a transistor 42. The transistor 42 can be, for example, an NMOS transistor and the fuse 40 can be a metallic such as copper and aluminum or a polysilicon layer.

The fuse 40 has a first voltage source A and a second voltage source B which are respectively supplied with a low voltage (for example, an input voltage $V_A=0V$ is supplied) and a high voltage (for example, an input voltage $V_B=5V$ is supplied). In addition, the insulation layer 102 above the second voltage source B has a laser window 44 for breaking the laser fuse 40 by shining a laser beam there.

The NMOS transistor 42 has an operating threshold voltage (for example, $V_{tNMOS}=1V$). The gate 48 (that is, poly 1) of the NMOS transistor 42 is connected to a position E between the first voltage source A and the second voltage source B using a low resistance metal line 46. Hence, the fuse 40 is equivalently divided into two resistor sections, in which section AE has a resistance R1 and section BE has a resistance R2. Actual values of the resistance R1 and R2 can be set as necessary according to demand. For example, R1 and R2 can be set in such a way that the value of R1 is four times that of R2, in other words, R1=4R, R2=R. The drain terminal C of the NMOS transistor 42 is connected to an input terminal 104 and the source terminal D of the NMOS transistor 42 is connected to an output terminal output terminal 106, for example.

Before any laser cutting operation, a voltage is supplied to the output terminal 106 from the input terminal 104. Hence, the drain terminal C and the source terminal D of the NMOS transistor 42 must have the same potential level (that is, $V_C=C_D$). In other words, the NMOS transistor 42 must conduct. Therefore, the gate terminal of the NMOS transistor 42 is greater than the threshold voltage ($V_{tNMOS}$). According to voltage divider rule of circuits, voltage $V_E$ at point E as shown in FIG. 4B can be computed:

$$V_E = \frac{R1VB + R2VA}{R1 + R2}$$

If various input voltages and resistors are set such that VA=0V, VB=5V, R1=4R and R2=R, voltage VE at the gate terminal of the NMOS transistor 42 is about:

$$V_E = \frac{5\,V*4R}{4R+R} = 4\,V$$

Since the threshold voltage of the NMOS transistor 42 is about 1V ($V_{tNMOS}=1V$), the NMOS transistor 42 is in a conductive state. Hence, potential at the drain terminal C and the source terminal D is identical (that is, $V_C=V_D$). Thus, a voltage is supplied by the input terminal 104 to the output terminal 106 via the drain terminal C and the source terminal D of the NMOS transistor 42.

Next, assume that the fuse 40 is cleanly cut after a laser beam shines on the laser window 44. Under such circumstances, the high voltage ($V_B=5V$) at the second voltage source B of the fuse 40 has no effect on voltage $V_E$ at point E. The voltage supplied to point E comes from the first voltage source A ($V_A=0V$) and so point E and the first voltage source A are at the same potential ($V_E=V_A=0V$). Since voltage at the gate terminal 48 is 0V, much lower than the threshold voltage ($V_{tNMOS}=1V$) of the NMOS transistor 42, the NMOS transistor 42 is in a cut-off state. Hence, the drain terminal C and the source terminal D are in an open state condition. In other words, voltage at the power source 104 can no longer feed the output terminal 106 via the drain terminal C and the source terminal D.

Next, assume that the fuse 40 is only partially cut. Although the high voltage (VB=5V) at the second voltage source B of the fuse 40 can still affect the voltage $V_E$ at point E, resistance R2 at the second input section BE will increase considerably after the laser operation. Suppose that the resistance R2 after the laser operation is 21R, voltage $V_E$ at point E can be computed:

$$V_E = \frac{5\,V*4R}{4R+21R} = 0.8\,V$$

Voltage at the gate terminal 48 is now about 0.8V, which is still lower than the threshold voltage ($V_{tNMOS}=1V$) of the NMOS transistor 42. Consequently, the NMOS transistor 42 is still in a cut-off state so that the drain terminal C and the source terminal D are in open circuit condition. In other words, voltage at the input terminal 104 still cannot feed the output terminal 106 via the drain terminal C and the source terminal D, by which the input terminal 104 and the output terminal 106 are isolated from and are not connected to each other. In such a case of the fuse 40 being only partially cut, the input terminal and the output terminal is maintained in an open status.

In the aforementioned fuse structure, a voltage lower than the threshold voltage must be supplied to the first input terminal so that the NMOS transistor will not conduct after the fuse is blown. Input voltage at the first and second voltage sources, the values of resistors R1 and R2, and the threshold voltage ($V_{tNMOS}$) can be selected according to the conditions of the partially broken fuse.

In summary, this invention provides an innovative fuse structure. The fuse actually comprises an NMOS transistor and a laser fuse. The advantages of the fuse structure is that an input voltage from the input terminal can no longer affect the output terminal even if the laser fuse is only partially cut instead of completely broken.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A laser fuse between an input terminal and an output terminal and formed inside an insulation layer above a substrate, comprising:

a fuse having a first voltage source terminal and a second voltage source terminal connected respectively to a first voltage and a second voltage, wherein the first voltage is lower than the second voltage and there is a laser window on a surface of the insulation layer above the second voltage source terminal; and a transistor having a gate terminal and a pair of source/drain terminal, wherein the gate terminal is connected to a pre-determined position between the two voltage source terminals of the fuse, one of the source/drain terminal is connected to the input terminal while the other source/drain terminal is connected to the output terminal.

2. The laser fuse of claim 1, wherein material forming the fuse includes a metal.

3. The laser fuse of claim 2, wherein the fuse is a copper fuse.

4. The laser fuse of claim 2, wherein the metal fuse is an aluminum fuse.

5. The laser fuse of claim 1, wherein material forming the fuse includes polysilicon.

6. The laser fuse of claim 1, wherein the gate terminal of the transistor and the point between the first and second voltage source terminals of the fuse are connected together via a metallic wire.

7. The laser fuse of claim 1, wherein the first voltage source terminal of the fuse is connected to a voltage of 0V.

8. The laser fuse of claim 1, wherein the transistor includes an NMOS transistor.

9. A laser fuse structure formed in an insulation layer above a substrate, comprising:

a fuse having a first voltage source terminal and a second voltage source terminal connected respectively to a first voltage and a second voltage, wherein the first voltage is lower than the second voltage and there is a laser window on the surface of the insulation layer above the second voltage source terminal; and a transistor having a gate terminal and a pair of source/drain terminals, wherein the gate terminal is connected to a pre-determined position between the first and second voltage source terminals of the fuse.

10. The laser fuse structure of claim 9, wherein material forming the fuse includes a metal.

11. The laser fuse structure of claim 10, wherein the fuse can be an aluminum fuse or a copper fuse.

12. The laser fuse structure of claim 9, wherein material forming the fuse includes polysilicon.

13. A laser fuse structure forming in an insulation layer above a substrate, comprising:

a fuse having a first voltage source terminal and a second voltage source terminal connected respectively to a first voltage and a second voltage, wherein the first voltage is lower than the second voltage and there is a laser window on the surface of the insulation layer above the second voltage source terminal; and a transistor having a gate terminal and a pair of source/drain terminal, wherein the gate terminal is connected to a pre-determined position between the two input terminals of the fuse, and the value of resistance of the section of the fuse from the first voltage source to the pre-determined position is a constant multiple of the value of resistance of the section of the fuse from the pre-determined position to the second voltage source.

* * * * *